United States Patent [19]

Connors et al.

[11] 4,179,316
[45] Dec. 18, 1979

[54] METHOD AND APPARATUS FOR HEAT TREATING

[75] Inventors: John F. Connors, Buffalo Grove; Douglas D. Bass, Western Springs; Michael G. Bell, Oak Lawn, all of Ill.; Stanley L. Ream, Columbus, Ohio

[73] Assignee: Sciaky Bros., Inc., Chicago, Ill.

[21] Appl. No.: 843,141

[22] Filed: Oct. 17, 1977

[51] Int. Cl.² ............................ C21D 1/06; C21D 1/12
[52] U.S. Cl. ............................ 148/152; 219/121 EM; 219/121 EB
[58] Field of Search ............... 148/152; 219/121 EM, 219/121 EB

[56] References Cited

U.S. PATENT DOCUMENTS

| | | | |
|---|---|---|---|
| 2,902,583 | 9/1959 | Steigerwald | 219/121 EM |
| 2,968,723 | 1/1961 | Steigerwald | 148/152 |
| 3,513,285 | 5/1970 | Imura | 219/121 EM |
| 3,949,228 | 4/1976 | Ryan | 219/121 EM |
| 4,047,984 | 9/1977 | Belke et al. | 148/152 |

*Primary Examiner*—W. Stallard
*Attorney, Agent, or Firm*—Julius L. Solomon

[57] ABSTRACT

This invention relates to a method and apparatus for surface hardening metals by means of a concentrated beam of electrons. The electron beam is directed and focused to a desired spot on the surface of the said workpiece and is caused to move incrementally from one to the next of a predetermined pattern of points on the work surface. The beam is directed to each point in turn for a predetermined length of time and moved from point to point at a relatively rapid rate. The pattern is projected over the desired surface of the work a predetermined number of times so that the material to be heat treated is brought above the transformation temperature and maintained below the melting temperature by close control of the electron beam parameters. A programmable computer retains in its memory a number of predetermined displacement patterns for the electron beam and controls all the electron beam gun parameters and all machine functions.

19 Claims, 15 Drawing Figures

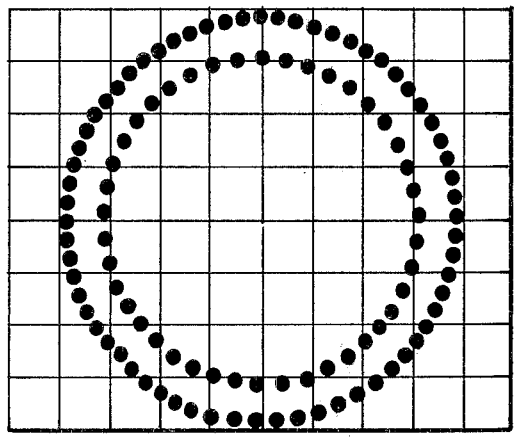
FIG. 3a
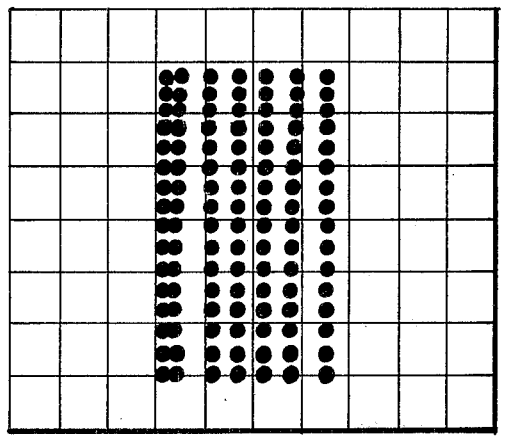
FIG. 3b
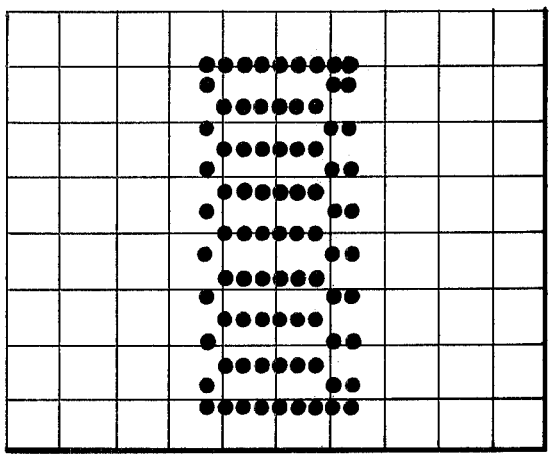
FIG. 3c
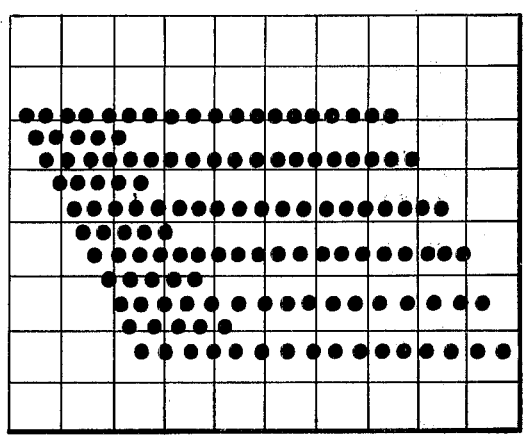
FIG. 3d
FIG. 3

| BEAM PARAMETER | | | |
|---|---|---|---|
| G0 | PAT 1 | BC300 | BF420 |
| G1 | M3 | F20 | |
| G1 | BC260 | BF425 | F20 |
| G1 | BC200 | BF430 | F40 |
| G1 | BC150 | BF435 | F40 |
| G1 | BC100 | BF440 | F40 |
| G0 | M5 | F400 | |
| G1 | M2 | | |

TABLE II

| NC BEAM POSITION | | | | |
|---|---|---|---|---|
| | G0 | XD −.310 | YD .300 | F200 |
| | G1 | YD −.300 | PD 10 | |
| | G0 | XD −.103 | F150 | |
| | G1 | YD .300 | | |
| | G0 | XD .103 | | |
| | G1 | YD −.300 | | |
| | G0 | XD .310 | F200 | |
| | G1 | YD .300 | | |

TABLE 13b

METHOD AND APPARATUS FOR HEAT TREATING

This invention relates to a method and apparatus for heat treating metal surfaces and, in particular, for surface hardening by means of an electron beam concentrated to a high power density.

The heat treatment of metals is an important industrial process which is utilized to impart to the metal desirable properties such as, toughness or hardness. For some applications, where steels are used for tools for working metals it is necessary that the material be hardened to as great a depth as possible so that the tool retains its cutting properties so that it may be ground periodically as it wears. Steel at room temperature consists of two phases:

(1) Ferrite, which is essentially iron that has very small amounts of dissolved carbon and alloying elements, and;
(2) Carbides, which are composed mainly of alloying elements and carbon.

To be hardened, the steel must be heated above a certain temperature, where the ferrite transforms to another structure called austenite. The quantity of carbon which the austenite is capable of accepting depends on the temperature, and this quantity decreases as the temperature is lowered. If the austenite is quenched at a sufficiently rapid rate, the carbon is not able to precipitate out of solution and remains trapped in the structure. The trapped carbon produces a super-saturated solution in ferrite, which is called martensite. It is the capacity of the steel to keep the carbon in solution and undergo the martensitic transformation which is the important factor in hardening. There is a great variety of carbon tool steels and alloy steels each of which when subjected to the proper heat treatment, results in a product having the desired characteristics for each specific application.

Whereas tools for metalworking require hardness throughout the material there are many industrial parts which require a hard, wear resistant surface and a ductile or tough core. Surfaces of such parts are hardened by carburizing, nitriding, cyaniding, or carbo-nitriding.

Carburizing requires that the parts be exposed to a carburizing gas at elevated temperatures for periods of about 5 to 72 hours or packed in a carburizing compound for this period. Carbon monoxide or methane is the carrier gas, and carbon dissolves in the austenite and penetrates below the surface by diffusion.

In nitriding, the parts are heated in an ammonia atmosphere at 450 to 540 degrees centigrade (850 to 1,000 degrees Fahrenheit) for about 8 to 96 hours. The material is hardened to a depth of up to 0.03 inches.

In cyaniding, small parts such as gears, ratchet pins and bushings, are heated in a molten bath of sodium cyanide from 10 minutes to 4 hours and are then quenched in water or oil. The parts may be hardened by this method to a depth of 0.025 inches.

In the carbo-nitriding process, the parts are subjected to a gaseous atmosphere containing hydrocarbons and ammonia at a temperature of 1200 to 1650 degrees Fahrenheit.

Another process by which steel parts may be hardened is the induction heating process. The parts are held adjacent to, or within, a coil through which alternating current passes. High frequencies are used for small parts or for surface heating and low frequencies are utilized for heating in-depth.

The carburizing, nitriding, and cyaniding processes are awkward to apply and are time consuming. Hardening by the use of the induction heating process requires somewhat less time and may be done on a production line basis, but requires the use of special shaped coils for each application.

Aside from the danger in working with noxious and poisonous gases and liquids and the production of air pollutants formed during the hardening process, all the above processes suffer from the inconvenience resulting from the parts being hardened becoming distorted because they are subjected to high temperatures for long periods of time. If the parts become distorted, it becomes necessary to re-work them by re-machining them to the required tolerance—a costly procedure made more costly because the parts are then in the hardened state.

The present invention is directed to the surface heat treatment of materials at extremely high speeds and is useful in overcoming the deficiencies in the above heretofore used methods of heat treating. The new heat treating process utilizes the high power density available in the electron beam which is generated by accelerating a beam of electrons by means of a high potential electro-static field and directing the electron beam by focusing and deflecting it along two mutually perpendicular axes so that the beam is played upon the work in a desired two dimensional pattern. In this manner, the parts may be heat treated at several localized areas without it being necessary to bring the total mass of the part to the proper heat treating temperature. Because of this, the total energy required by this new process is only a fraction of the energy which must be utilized in the older processes for heat treating the same parts. The type of parts which lend themselves to this method of heat treating include cams, spindles, rotors, bearing races, clutch stators, piston rings, tool joint ends, ball joints, cylinder liners, turbine blades, machine tool surfaces, valve seats, etc. With this process, the localized surface to be heat treated is rapidly brought to the proper temperature, maintained for a suitable length of time and the treated area usually self-quenched by the surrounding mass of metal in the part. There is no need for a quenching medium such as a water spray or an oil bath to be utilized. During the heat treating process, the motion of the electron beam is under control of a minicomputer which has been programmed by the operator to control the deflection coils of the electron gun along two axes so that the beam is stepped instantaneously from one point to the next in a predetermined pattern. The beam remains fixed at each point for a predetermined interval of time so as to produce a pattern of spots of heat over the surface which is being heat treated. The concentration of spots may be varied from area to area over the surface being heat treated. In order to accommodate the particular shape or form of the part being heat treated in accordance with the invention, the computer is so organized that the operator may program the computer to produce the desired heat treat pattern through the use of an input keyboard attached to the computer. The heat treat pattern program is displayed, in accordance with the invention, on a cathode ray oscilloscope. Once a program is keyed into the computer and stored in computer memory, it may be recalled by keying-in a suitable code. It is the object of this invention to make possible the heat treatment of intricately shaped parts with the least expenditure of energy and time.

Another object of the invention is to produce a pattern of heat spots upon a work surface over a localized area of a workpiece.

Another object of the invention is to produce a rapid rise in temperature over a localized area of a workpiece.

Another object is to produce a pattern of electron beam impingement points over a localized surface of a workpiece in which the concentration of spots per unit of area varies over the surface being heated.

Another object is to allow for the storage of a number of different heat treat patterns in the memory of the computer.

Another object is to provide a relatively simple method of introducing a heat treat pattern into the heat treating machine.

An ancillary object is to provide a heat treating system which does not require separate quenching baths or devices.

Another object is to provide means for surface heat treating selected areas on the surface of an object by generating an electron beam and controlling the electron beam current, voltage, and focus and dynamic application of the beam over the area to be heat treated by means of a computer control device.

Another object of the invention is to surface harden a workpiece with no appreciable distortion resulting in the workpiece due to the hardening process.

These and other objects and advantages will become more apparent in view of the following detailed description taken in conjunction with the drawings described below.

FIG. 1—is a block diagram showing the essential elements of the apparatus in accordance with this invention.

FIG. 2—is a schematic drawing of the essential elements of an electron beam gun and its power supply.

FIG. 3—illustrates a number of heat treat patterns showing the points at which the electron beam is applied to the surface of the work.

FIGS. 4, 5, 6, and 7—illustrate several machine parts suited to application of the electron beam heat treat process.

FIG. 8—shows the macro-structure of a section, 8—8 of the part shown in FIG. 7 after heat treatment by the electron beam.

FIG. 9 shows the macro structure of another section, 9—9, of the heat treated area of the part shown in FIG. 7.

FIG. 10—is a graph illustrating a mode of operation of the invention.

FIG. 11 is a table of computer instructions for producing the energy profile of FIG. 10.

FIG. 13B is a table of computer instructions for treating the workpiece shown in FIG. 13A.

Figure 1:
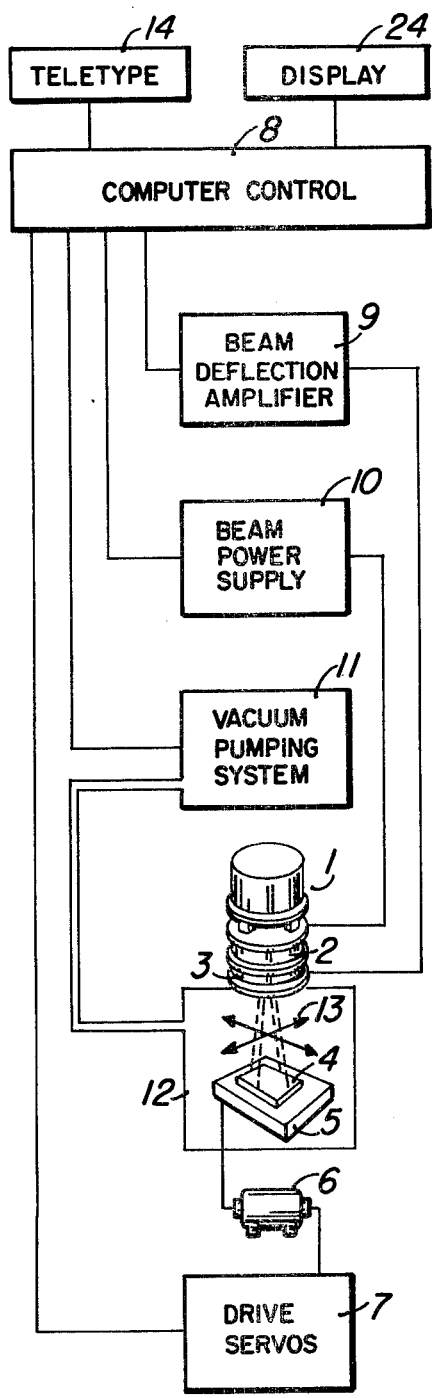

Referring now to FIG. 1, which illustrates the complete system for heat treating by an electron beam under control of a computer, we may note the electron beam gun "1" fitted with a focus coil "2", for focusing the electron beam on the work and deflection coils "3" for deflecting the beam along two mutually perpendicular axes so that the beam strikes the work to be heat treated in accordance with a predetermined program which has previously been placed in the memory of the computer control "8" by the system operator. The workpiece "4" is mounted upon a carriage "5" within a vacuum chamber "12" which is maintained at a low pressure suitable for the electron beam heat treating process by vacuum pumping system "11". The motion of carriage "5" is effected along several axes of required motion by means of servo motor "6" which is controlled by servo drive "7". The motor positions the carriage within the chamber so that the work will be properly positioned with respect to the resting position of the electron beam "13" which is deflected by the action of the magnetic fields of the X and Y axis deflection coils which are under control of beam deflection amplifiers "9", which in turn are controlled by information previously stored in the computer control memory. Computer "8" not only controls the beam deflection program, but also controls the electron beam gun parameters of accelerating potential, beam current, focus coil current, as well as the vacuum pumping system and the servo drives which are utilized to position in sequence a batch of parts supported by a suitable holding fixture within the chamber. In order to heat treat a batch of parts, the operator would mount the parts upon a supporting fixture inside the vacuum chamber, close the door of the vacuum chamber, and initiate the functioning of the machine by pressing a "start" button. The computer control then takes over the operation causing the vacuum valves to be operated so that the vacuum chamber "12" in which the parts have been placed is evacuated rapidly, the electron beam gun energized, and the beam controlled so that the desired heat treat pattern is projected onto the workpiece for the desired length of time, the electron beam gun de-energized, and the next part moved into position under the electron beam gun. The operation is extremely fast; a ten cubic foot chamber may be pumped down in less than 30 seconds and each part heat treated in a matter of 2 or 3 seconds to provide multiple part processing at very high production rates. In addition to controlling the operation of the machine functions, all parameters are monitored by suitable transducers and changes in the value of any of the parameters are displayed on a cathode ray oscilloscope "24". By means of a teletype "14" or other input device, the computer is programmed to provide a continuous output of 2 channel X/Y coordinate information. These two output signals are provided to the input terminal of a current amplifier "9" which controls the currents in an X/Y electro-magnetic deflection coil assembly "3". The deflection coil assembly "3" is used to deflect the electron beam passing through it along two mutually perpendicular axes. Thus, the output of the computer is used to deflect the electron beam in a program pattern for the purpose of selected surface heating. In previous attempts at electron beam heat treating, square, triangular, and parabolic wave shapes of various frequencies were fed to the X and Y deflection coils of the electron beam gun system in order to cause the beam to sweep the surface of the work in accordance with the Lissajou patterns formed by the application of these signals to the deflection coils. The patterns developed on the work proved to be unsatisfactory and limited in application. The use of a computer to control directly the position of the electron beam provides infinitely variable control of average electron beam power and in the distribution of the electron beam power over the desired surface. In its simplest form, a symmetrical 11×11 matrix of 121 point locations is programmed into the computer "8" by means of the teletype "14". The master program within the computer causes the two axes information to be delivered to the deflection coils "3" repeatedly at a pre-programmed rate, such as 100 matrices (or frames) per second. The advantages of computer controlled deflection over the previously tried method are several.

(1) When projecting the Lissajou pattern upon the work surface, inherently there results many cross-over points and consequently, over temperature conditions occur at these points. With computer controlled deflection, beam path cross-over points are eliminated. The rate of surface heating can, therefore, be more rapid and accurately controlled since the energy delivered by the electron beam to the surface of the work at each point is the same for each point or may be varied to omit the particular application.

(2) The average beam power density can be very accurately controlled to provide heat inputs necessary for complex part geometries such as gears and cams.

(3) Using computer memory or other storage devices such as paper tape, magnetic drums or tape, pattern information for a variety of heat treating requirements can be stored for rapid recall and application.

(4) More sophisticated computer programs can be used to alter continuously the average power in the deflected beam so that complex geometries such as gears may be heat treated by rotation of the gear beneath the deflected beam.

(5) Deflection pattern information in the computer may be used to program other memory devices such as electronic memories which will provide pattern output signals and allow the computer to be used for other machine functions.

Figure 2:
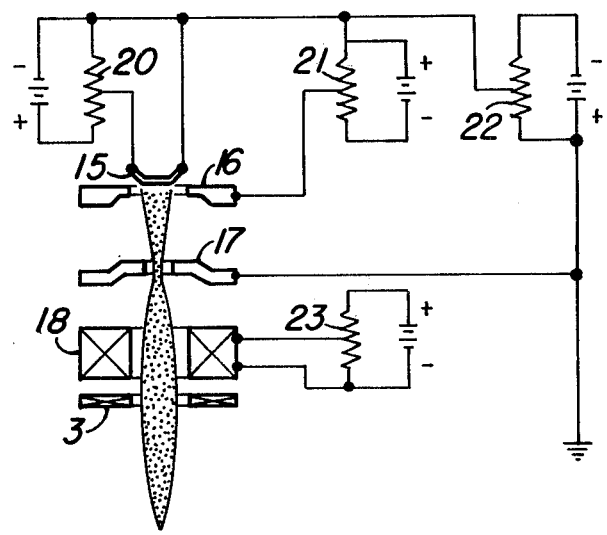

FIG. 2 illustrates in schematic form the general arrangement of the principle elements of an electron beam gun and its associated electrical supplies. The elements of an electron beam gun comprises a filament "15", a cathode "16", an anode "17", a focus coil "18", deflection coils "3", and their associated supplies, "20", "21", "22", and "23". Filament current supply "20" delivers current to filament "15" and brings the temperature of the filament to the level at which it is in condition to deliver electrons. A high voltage power supply "22" applies a potential of 60,000 volts to anode "17" with respect to the filament "15" to cause the electrons to be accelerated towards the anode and through an aperture in the anode so as to form a beam of electrons moving at a velocity which may approach the speed of light. The cathode "16" and anode "17" are shaped in such a manner as to create an electrostatic field between the anode and the cathode which causes the electron beam to be directed towards a point a short distance outside of the anode. An adjustable DC power supply "21" of approximately 2,000 volts is applied between the filament and the cathode and by this means, the intensity of the electron beam current may be controlled. Increasing the negative potential on the cathode with respect to the filament reduces the electron beam current and vice versa. Beyond the opening in the anode there exists a field free space through which the beam passes through the focus coil "18" where it is focused to a desired spot on a workpiece by adjusting the focus current applied to the focus coil by power supply "23".

Figure 13C:
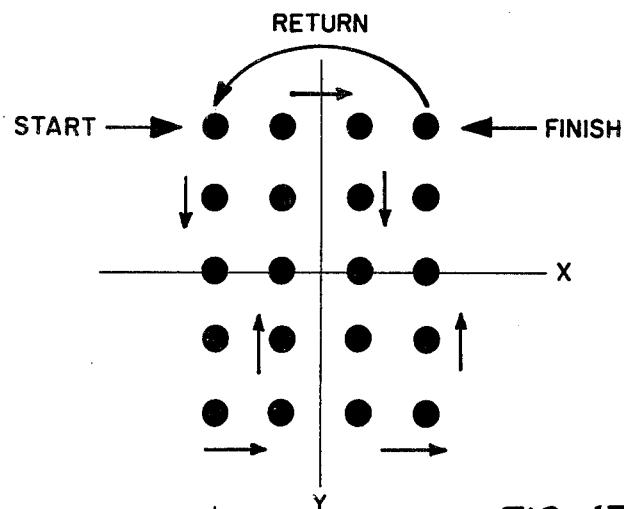
FIG. 13C illustrates a matrix of points which are used to heat treat the part shown in FIG. 13A.

Directly below the focus coil, the deflection coils "3" cause the beam to be deflected along two axes so as to cause the beam to impinge at a desired point upon the work. The output of all the various current and voltage supplies for the electron beam gun may be controlled by the computer and all may be programmed so that these values may be modified and varied during the generation of the points in the matrix or varied for each complete matrix. For example, each successive matrix may be made to differ in beam current during the passage of a series of matrices so as to produce the desired heating effect upon the workpiece. The matrix of FIG. 3 represents the points at which the beam is programmed to strike. This matrix may be displayed upon the screen of the cathode ray oscilloscope by the operator pressing the appropriate code on the keyboard of the teletypewriter. The brightness of the dots on the screen are an indication of the length of time the beam remains at that particular spot. Brighter dots indicate longer beam duration. The computer may be programmed to deliver a matrix of beam application points which are tailored in shape and in spot duration to suit the particular requirements of the parts to be heat treated. The matrix may be rectangular, triangular, circular, oval, annular, or any other desired shape. The density of the spots may also be programmed to vary from area to area over the matrix. This type of non-uniform power density matrix is convenient in those cases where the mass of material under or surrounding the surface to be heat treated varies in thickness or density from spot to spot. Those areas from which the heat would be removed more rapidly would be treated with a greater number of spots per unit area whereas those areas from which the heat could be transferred only at a very slow rate would be treated with a lesser number of spots per unit area. In this manner the temperature over the surface of the area being treated may be made uniform and the surface brought very close to the temperature at which the material would melt so that the quantity of carbon which the austenite is capable of accepting is a maximum so as to produce the greatest hardening effect at the highest speed. At the instant the electron beam matrix is removed from the work surface by cutting off the electron beam current, the temperature of the heated surface drops rapidly below the transformation point as the heat is rapidly conducted into the mass of the material below the surface so that a minimum of carbon precipitates from the hardened area. FIG. 3 illustrates several variations in matrix program. FIG. 13C illustrates a matrix of points which are to be used to heat treat the part shown in 13A over the surface indicated. The program to be stored in the computer, which will direct the machine to perform the desired steps of motion of the electron beam, is shown in table 13B. The computer is organized to accept positional beam dwell time, number of points per inch, direction of the beam during rotary motion, and electron beam gun parameter information through the use of a preparatory code. For example, G0 followed by the positional coordinates will define one point. G1 will define a line containing a multiplicity of points. PD followed by a number will define the number of points per inch. F followed by a number will define the dwell time per point in microseconds. Referring to table 3B, the first block of information will direct the beam to go to the starting point defined by the X coordinate −0.310 and the Y coordinate 0.300 and to dwell at that point for 200 microseconds. The next block of information, G1, YD −0.300

Figure 13A:
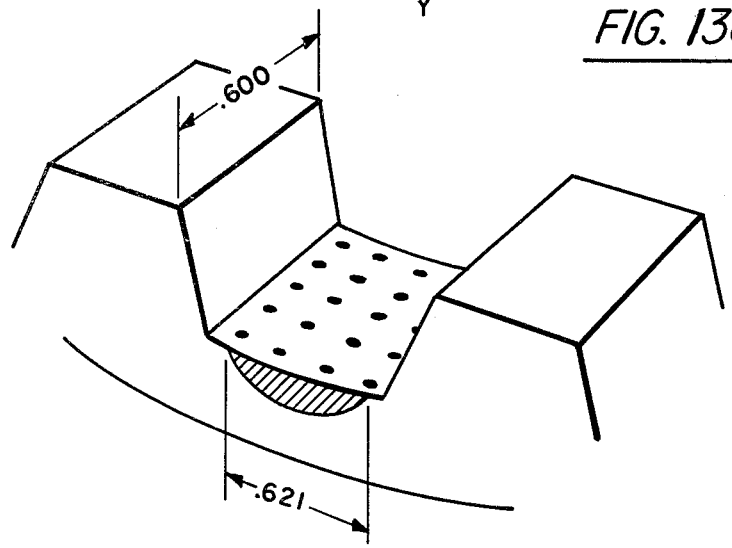
FIG. 13A illustrates a portion of a workpiece to be treated by this method.

PD 10, will direct the beam to move incrementally from the first point defined above to Y −0.300 at 10 points per inch with the beam remaining at each point for a duration of 200 microseconds (F200), after which it is rapidly moved to the next point along the line. The third block of information directs the beam to move from the point defined by X −0.310 Y −0.3 to X −0.103 Y −0.3 and to remain at this point for 150 microseconds (F150). The fourth block directs the beam to move incrementally from the last defined point to X −0.103 Y 0.300 with ten points to the inch, remaining in each position for a period of 150 microseconds. The program continues through block 8 and will cause the beam to move from spot to spot in accordance with the pattern and path indicated in FIG. 13A, finishing at point X 0.310 Y 0.300 and remaining there for a period of 200 microseconds. If desired, the pattern may be repeated as many times as is required. In the program illustrated above, one value of points per inch was utilized and two values of beam dwell time were utilized. By suitable instructions, the beam current, beam focus current and beam accelerating potential, may be programmed either singly or all at once, to vary exponentially or in accordance with any desired law during the application of the electron beam to the work surface so as to deliver to the work surface incremental energy in accordance with a desired program or profile of energy versus time. A typical program to produce such an energy profile is illustrated in Table 11 which directs the beam in the first block of instructions to produce or deliver pattern No. 1 which has previously been programmed into the computer in accordance with the instructions similar to those illustrated in Table 3B and to deliver a beam current BC of 300 milliamperes and a beam focus current BF of 420 milliamperes. In accordance with the program of Table 11, by the M3 instruction, the high voltage will be turned on and pattern No. 1 formed with a beam current of 300 milliamperes and a beam focus current of 420 milliamperes and will remain on for a period of 0.2 seconds (F20). The third block of information directs the beam to change with linear interpolation from 300 to 260 milliamperes beam current and the beam focus from 420 to 425 milliamperes during a period of 0.2 seconds.

Figure 4:
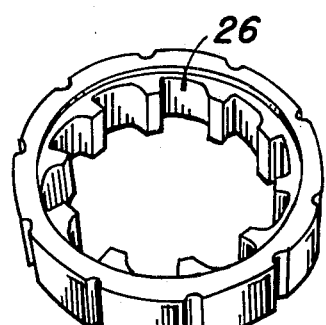
Figure 10:
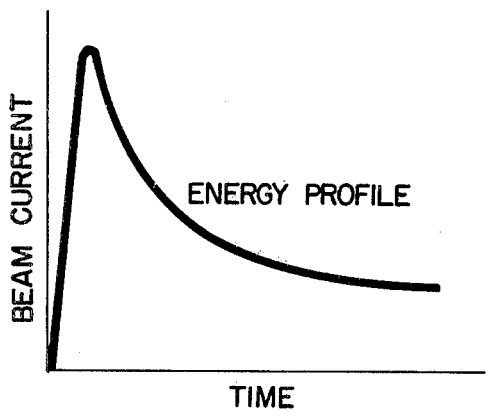
Figure 12:
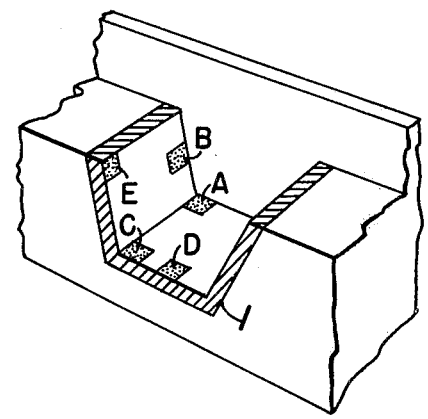
FIG. 12 illustrates a portion of a workpiece which requires the application of different amounts of energy at different points during the heat treat cycle.

The fourth block directs the beam current to be dropped from 260 milliamperes to 200 milliamperes and the beam focus current to be increased from 425 milliamperes to 430 milliamperes over a time of 0.4 seconds. The fourth block drops a current from its last level to 150 milliamperes and increases the focus current to 435 milliamperes during a period of 0.4 seconds. The sixth block directs the current drop to 100 milliamperes during the next 0.4 seconds. The seventh block directs the high voltage to be turned off (M5) and remain off for 4 seconds. The M2 instruction in the eighth block signifies the end of a part program. FIG. 12 illustrates a portion of a workpiece which requires the application of different amounts of energy at different points during the heat treat cycle. The area A which is a double inside corner would require the greatest amount of heat input because the transmission of heat away from that area will be the greatest. Area B, an inside corner, will require slightly less energy. Area C, an inside-outside corner, will require still less. Area D, an outside corner, and area E, open on two sides, requiring the least energy input. By proportioning the energy input in this fashion the temperature over the surface of the area to be heat treated may be brought to a uniform temperature throughout so that no melted spots will develop because of too high heat input or because of poor heat transmission from that particular area. FIG. 4 is an example of a part which can be effectively heat treated by means of this new process and apparatus. A turntable is utilized in this case to index the part from one position to the next. The machine being programmed to repeat a fixed heat treat program successively for each of the 10 areas corresponding to the area "26".

Figure 5:
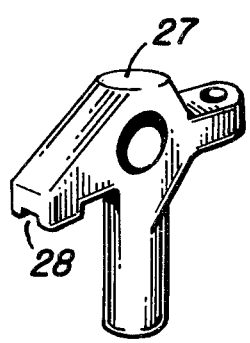

FIG. 5 is a drawing of an automobile engine part which is surface hardened in the areas "27" and "28".

Figure 6:
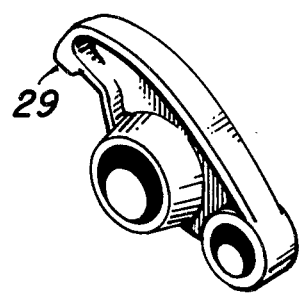

FIG. 6 is a drawing of a rocker arm component of an automobile engine which is hardened in the area "29".

Figure 7:
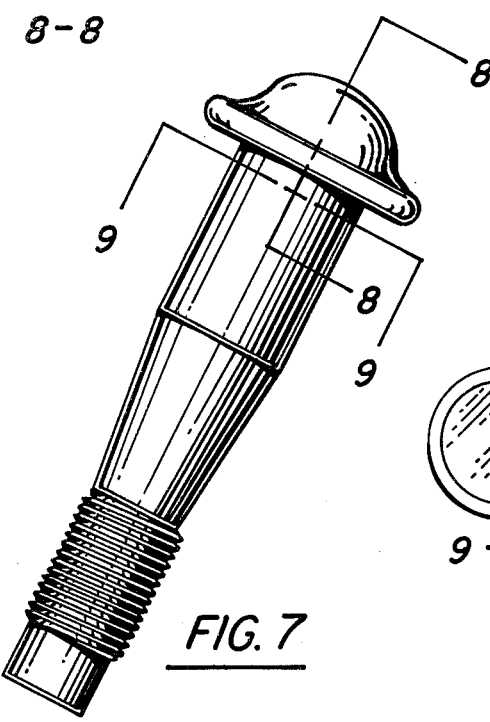

FIG. 7 illustrates an automobile ball stud which is electron beam heat treated in two separate areas on the stud.

Figure 8:
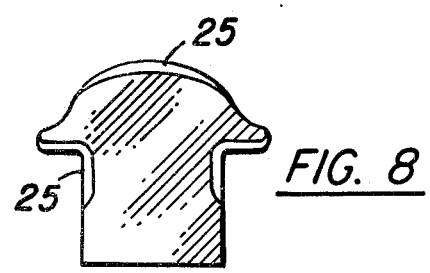

FIG. 8 shows the macro structure of a section taken at 8—8.

Figure 9:
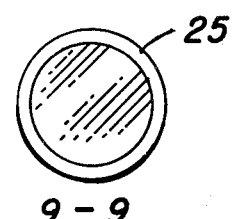

FIG. 9 shows the macro structure of a section taken at, 9—9, as viewed from the top showing depth of heat treatment at 25.

In all the examples illustrated here, a part is subjected to the electron beam matrix for a period of no longer than 2 to 3 seconds. The surface of the treated area is rapidly brought to the proper temperature, thanks to the high power density of the electron beam of as much as $10^8$ kilowatts per square millimeter, and the part maintained at this temperature by programming the beam current for a period long enough to achieve the desired hardness and depth of penetration.

The foregoing is a description of one embodiment of the present invention and should not be construed in the limiting sense but only as describing the underlying concepts involved. The invention should be limited only by the scope of the following claims:

What is claimed is:

1. A method of surface hardening selected areas of a metal workpiece by means of a concentrated beam of electrons comprising the steps of: generating a beam of electrons;

directing and focusing the said beam of electrons to a desired spot on the surface of the said workpiece;

causing the beam to be displaced to and to dwell in sequence for a pre-settable period ranging from 2 to 200 micro-seconds at each of a pre-determined matrix of spots over the said selected area in a pre-determined order;

repeating without interruption the said beam displacement and dwell sequence and matrix a pre-set number of times and controlling the beam current so that the material of said selected area and that adjacent to it reaches a temperature above the transformation temperature and close to the melting point for said material and is maintained at the said temperature for a pre-determined interval;

terminating the flow of electron beam current and allowing the material to be quenched rapidly.

2. A method of surface hardening selected areas of a metal workpiece as in claim 1 in which the said beam displacement and dwell sequence and matrix is repeated at rates above 20 frames per second.

3. A method in accordance with claim 1 including the step of varying the electron beam parameters during the time the electron beam is applied to the workpieces.

4. A method in accordance with claim 1 in which that portion of the material which has been heated by the electron beam is allowed to be quenched solely by the surrounding material of the part being heat treated.

5. A method in accordance with claim 1 in which cooled segments of a segmented mandrel are brought into contact with the body of the workpiece after termination of the electron beam current so as to reduce its temperature rapidly.

6. A method in accordance with claim 1, including the step of varying the pattern of displacement of the electron beam on the work surface being heat treated during the time of application of the electron beam on the said work surface.

7. A method in accordance with claim 1, including the step of rotating cylindrically shaped workpieces about their longitudinal axis during the heat treating process.

8. Apparatus for surface hardening selected areas of a metal workpiece by means of a concentrated beam of electrons comprising: a vacuum chamber;
an electron beam generator associated with said chamber;
means for generating, accelerating, and focusing an electron beam;
computer control means for deflecting the electron beam so as to cause it to be displaced to and to dwell in sequence for 2 to 200 micro-seconds at each of a pre-determined matrix of spots over a selected area on a work surface
means for repeating without interruption the said beam displacement and dwell sequence and matrix a pre-set number of times;
means for supporting the said workpiece within the said vacuum chamber;
means for positioning the said workpiece on said workpiece supporting means;
means for evacuating the said vacuum chamber;
and means associated with said computer means for controlling the electron beam gun parameters, workpiece translating means and other machine functions.

9. Apparatus in accordance with claim 8 including means in said computer means for storing predetermined programs of beam spot translation and dwell time.

10. Apparatus as in claim 9, including means for producing a predetermined matrix of beam spot dwell points upon the surface of the workpiece.

11. Apparatus as in claim 9, including means for controlling the current through deflection coils associated with said electron beam generator so as to cause the said electron beam to be translated on the work surface in accordance with said predetermined program of beam spot translation and dwell time.

12. Apparatus as in claim 10, including means for programming a multiplicity of different matrices and storing said programs in a memory bank of said computer.

13. Apparatus in accordance with claim 11, including means for applying a series of said matrices sequentially to the surface of said workpiece.

14. Apparatus as in claim 12, including means for producing a matrix of electron beam impingement points on a work surface in which the power density of the electron beam varies from spot to spot over the area of the matrix.

15. Apparatus as in claim 12, including means for quenching selected portions of the workpiece.

16. Apparatus as in claim 15, in which the said means for quenching is a segmented mandrel arranged to be brought into contact with the workpiece after the heat treatment beam current is terminated.

17. Apparatus in accordance with claim 16, including pneumatic and hydraulic means for operating the said segmented mandrel.

18. Apparatus in accordance with claim 16, including means for translating the workpiece so that it may be positioned so that the resting position of the electron beam will impinge at approximately the center of a series of selected surfaces on the workpiece.

19. Apparatus as in claim 16, including means for rotating cylindrical workpieces from electric servo operators mounted outside the vacuum chamber.

* * * * *